United States Patent

Okanobu et al.

[11] Patent Number: 5,285,172
[45] Date of Patent: Feb. 8, 1994

[54] CURRENT MIRROR POWER AMPLIFIER WITH GAIN CONTROLLED BY RESISTOR-CAPACITOR NETWORK

[75] Inventors: Taiwa Okanobu, Tokyo; Hitoshi Tomiyama, Kanagawa, both of Japan

[73] Assignee: Sony Corporation, Tokyo, Japan

[21] Appl. No.: 939,601

[22] Filed: Sep. 2, 1992

[30] Foreign Application Priority Data

Sep. 5, 1991 [JP] Japan .................. 3-254795

[51] Int. Cl.$^5$ .................................................. H03F 3/21
[52] U.S. Cl. ...................................... 330/288; 381/120
[58] Field of Search ................ 307/296.1; 323/315, 323/316; 330/288, 294, 296, 302, 281, 285; 381/120

[56] References Cited

U.S. PATENT DOCUMENTS

4,866,312  9/1989  Kearney et al. ............... 330/288 X

*Primary Examiner*—Steven Mottola
*Attorney, Agent, or Firm*—Lewis H. Eslinger; Jay H. Maioli

[57] ABSTRACT

An amplifier in which a current mirror circuit 53 is formed of a transistor Q25 on the input side and a transistor Q26 on the output side. The base-emitter junction area of the transistor Q26 is set to be N (N>1) times as large as that of the transistor Q25. A parallel circuit of a resistor R25 and a capacitor C25 is connected between the base of the transistor Q25 and its bias point Q27. A resistor R26 is connected between the base of the transistor Q26 and the bias point Q27. The resistance value of the resistor R25 is set to be virtually N times as large as the resistance value of the resistor R26. When an input current i25 is supplied to the transistor Q25, an output current i26, which is N times as large as the input current, is obtained from the transistor Q26 on the output side, whereas the output current i26 is held lower than N times of the input current i25 when the frequency of the input current is high.

2 Claims, 3 Drawing Sheets

FIG. 3

CURRENT MIRROR POWER AMPLIFIER WITH GAIN CONTROLLED BY RESISTOR-CAPACITOR NETWORK

BACKGROUND OF THE INVENTION

1. Field of the Invention

The present invention relates to a wideband amplifier for use, for example, in an AM radio receiver.

2. Description of the Related Art

When integrating a radio receiver into a one-chip IC arrangement, if the intermediate-frequency filter is formed of a ceramic filter or the like, it becomes impossible to incorporate the intermediate-frequency filter into the IC.

Accordingly, it is considered as a solution to form the intermediate-frequency filter of an active filter using resistors, capacitors, and operational amplifiers. In such case, if the intermediate frequency $f_i$ is set to its standard value, 450 kHz, satisfactory results cannot be obtained because, then, the area occupied by the active filter on the semiconductor pellet becomes too great.

Accordingly, it is further considered to reduce the intermediate frequency $f_i$ to a value sufficiently lower than the frequency band of the received signal, to 55 kHz, for example.

Figure 3:
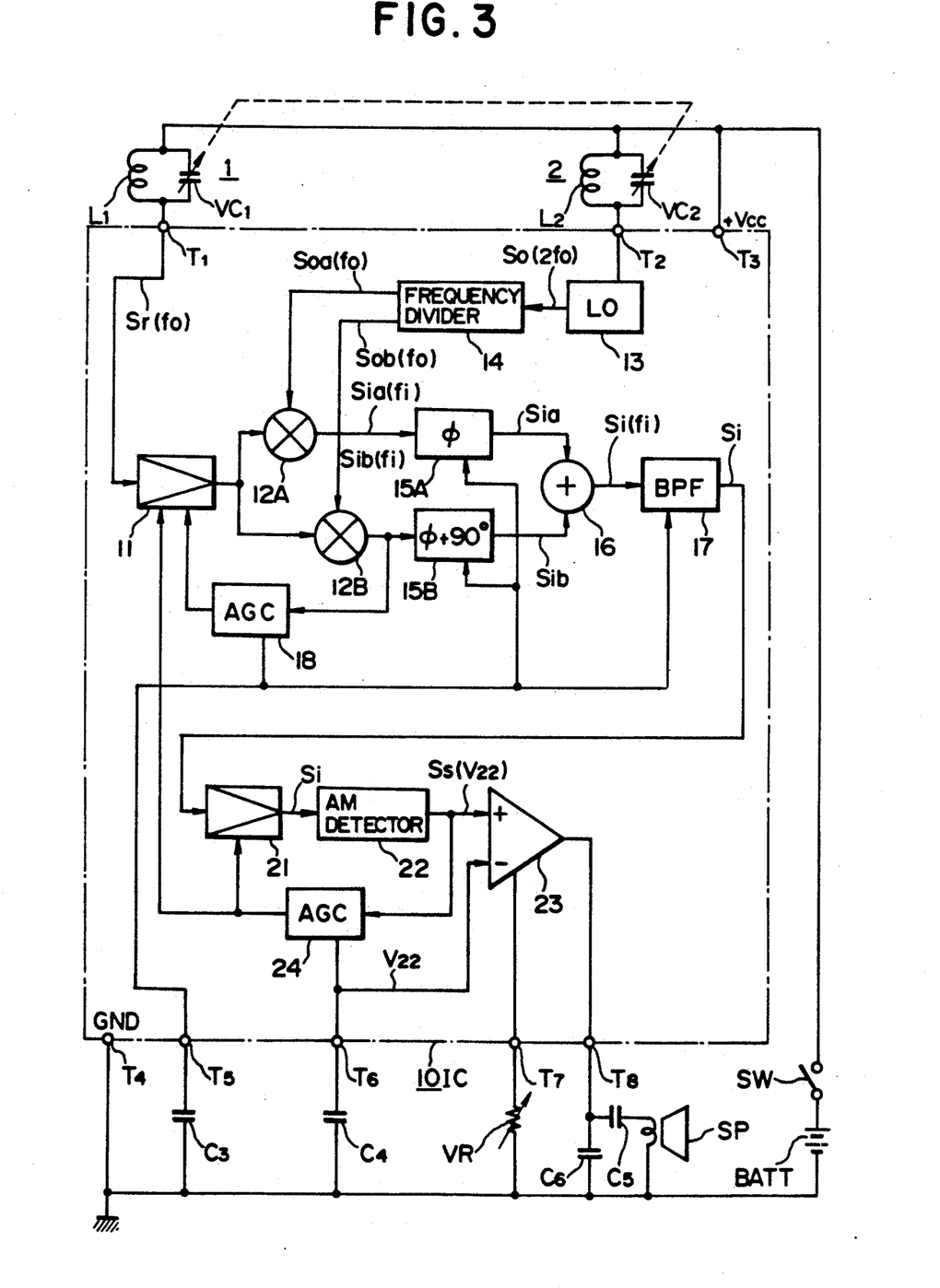
FIG. 3 is a system diagram showing an example of a one-chip IC receiver.

FIG. 3 is a diagram showing an example of such IC or radio receiver. Referring to FIG. 3, the portion 10 enclosed by a chain line indicates an IC for the one-chip IC AM receiver and T1 to T8 denote its external terminal pins, of which the pin T3 is a power supply pin and the pin T4 is a grounding terminal pin.

The parts located outside the chain line are parts or circuits externally connected to the IC, of which reference numeral 1 denotes an antenna tuner and 2 denotes a resonator for local oscillation. The tuner 1 is formed of a bar antenna (antenna tuning coil) L1 and a variable capacitor VC1 and the resonator 2 is formed of a local oscillation coil L2 and a variable capacitor VC2 associated with the variable capacitor VC1.

Further, SW denotes a power supply switch, BATT denotes a power supply battery, for example, of 3 V, VR denotes a variable resistor for volume control, and SP denotes a speaker.

By the antenna tuner 1, a broadcast wave signal $S_r$ with a frequency $f_r$ $$S_r = E_r \cdot \sin \omega_r t$$

$$\omega_r = 2\pi f_r$$

is selectively acquired. Since what are relevant to signal processes described hereinafter are only the relative amplitude and phase between these signals, the initial phase is neglected in the above expression and in the following description.

The signal $S_r$ is supplied to a high-frequency amplifier 11 through the terminal pin T1 of the IC 10, and the signal $S_r$ from the amplifier 11 is supplied to a first and a second mixer 12A and 12B.

To the resonator 2, a local oscillator 13 is connected through the terminal pin T2, and therein, a local oscillation signal $S_o$ is generated. At this time, the oscillation frequency of the oscillation signal $S_o$ is set to $2f_o$ such that $$2f_o = (f_r + f_i) \times 2,$$

where $f_i$ is an intermediate frequency, $f_i = 55$ kHz.

The oscillation signal $S_o$ is supplied to a frequency divider (counter) 14 and divided into local signals $S_{oa}$ and $S_{ob}$ with a half the original frequency and a phase difference of 90° therebetween. More specifically, the oscillation signal $S_o$ is divided for frequency into $S_{oa}$ and $S_{ob}$ such that $$S_{oa} = E_o \cdot \cos \omega_o t,$$

$$S_{ob} = E_o \cdot \sin \omega_o t,$$

where $$\omega_o = 2\pi f_o.$$

These signals $S_{oa}$ and $S_{ob}$ are supplied to the mixers 12A and 12B, respectively, to be multiplied by the signal $S_r$, and the following signals $S_{ia}$ and $S_{ib}$ are taken out from the mixers 12A and 12B $$\begin{aligned}
S_{ia} &= S_r \cdot S_{oa} \\
&= E_r \cdot \sin \omega_r t \cdot E_o \cdot \cos \omega_o t \\
&= \alpha \{\sin(\omega_r + \omega_o)t + \sin(\omega_r - \omega_o)t\},
\end{aligned}$$

$$\begin{aligned}
S_{ib} &= S_r \cdot S_{ob} \\
&= E_r \cdot \sin \omega_r t \cdot E_o \cdot \sin \omega_o t \\
&= \alpha \{-\cos(\omega_r + \omega_o)t + \cos(\omega_r - \omega_o)t\},
\end{aligned}$$

where $$\alpha = E_r \cdot E_o / 2.$$

As described later, the signal components with the angular frequency $(\omega_r - \omega_o)$ out of the above signals $S_{ia}$ and $S_{ib}$ are used as the intermediate-frequency signals and the signal components with the angular frequency $(\omega_r + \omega_o)$ are eliminated. Hence, neglecting, for simplicity, the signal components with the angular frequency $(\omega_r + \omega_o)$ in the above expressions, we obtain $$S_{ia} = \alpha \cdot \sin(\omega_r - \omega_o)t,$$

$$S_{ib} = \alpha \cdot \cos(\omega_r - \omega_o)t.$$

An image signal $S_m$, at this time, is expressed as $$S_m = E_m \cdot \sin \omega_m t,$$

where $$\omega_m = \omega_o + \omega_i,$$

$$\omega_i = 2\pi f_i.$$

Hence, if the image signal $S_m$ is included in the broadcast wave signal $S_r$ from the tuner 1, then the signals $S_{ia}$ and $S_{ib}$' become $$S_{ia} = \alpha \cdot \sin(\omega_r - \omega_o)t + \beta \cdot \sin(\omega_m - \omega_o)t,$$

$$S_{ib} = \alpha \cdot \cos(\omega_r - \omega_o)t + \beta \cdot \cos(\omega_m - \omega_o)t,$$

where $\beta = E_m \cdot E_o / 2$. Further, since $$\omega_r < \omega_o < \omega_m,$$

the above expressions become $$S_{ia} = \alpha \cdot \sin(\omega_r - \omega_o)t + \beta \cdot \sin(\omega_m - \omega_o)t$$
$$= -\alpha \cdot \sin(\omega_o - \omega_r)t + \beta \cdot \sin(\omega_m - \omega_o)t,$$

$$S_{ib} = \alpha \cdot \cos(\omega_r - \omega_o)t + \beta \cdot \cos(\omega_m - \omega_o)t,$$
$$= \alpha \cdot \cos(\omega_o - \omega_r)t + \beta \cdot \cos(\omega_m - \omega_o)t.$$

These signals $S_{ia}$ and $S_{ib}$ are supplied to phase shifters 15A and 15B. The phase shifters 15A and 15B are formed, for example, of active filters using capacitors, resistors, and operational amplifiers. The signal $S_{ia}$ is shifted for phase in the phase shifter 15A by a value $\phi$ and the signal $S_{ib}$ is shifted for phase in the phase shifter 15B by a value ($\phi+90°$), and thereby, the two input signals $S_{ia}$ and $S_{ib}$ are shifted for phase so as to have the phase difference $90°\pm1°$ therebetween, within the frequency range of 55 kHz$\pm$10 kHz.

Thus, the signal $S_{ib}$ is arranged to lead the signal $S_{ia}$ by 90° after phase shifting by the phase shifters 15A and 15B, and these signals become $$S_{ia} = -\alpha \cdot \sin(\omega_o - \omega_r)t + \beta \cdot \sin(\omega_m - \omega_o)t,$$

$$S_{ib} = \alpha \cdot \cos\{(\omega_o - \omega_r)t + 90°\} + \beta \cdot \cos\{(\omega_m - \omega_o)t + 90°\}$$
$$= -\alpha \cdot \sin(\omega_o - \omega_r)t - \beta \cdot \sin(\omega_m - \omega_o)t.$$

These signals $S_{ia}$ and $S_{ib}$ are supplied to an adder 16 to be added together. From the adder 16 is obtained a signal $S_i$ expressed as $$S_i = S_{ia} + S_{ib}$$
$$= -\alpha \cdot \sin(\omega_o - \omega_r)t + \beta \cdot \sin(\omega_m - \omega_o)t +$$
$$\{-\alpha \cdot \sin(\omega_o - \omega_r)t - \beta \cdot \sin(\omega_m - \omega_o)t\}$$
$$= -2\alpha \cdot \sin(\omega_o - \omega_r)t.$$

Since, here, $$\omega_o - \omega_r = 2\pi(f_o - f_r)$$
$$= 2\pi f_i,$$

the signal $S_i$ is the desired intermediate-frequency signal. Further, it is known that, even if an image signal $S_m$ is included in the broadcast wave signal $S_r$ from the tuner 1, the intermediate-frequency signal $S_i$ does not include signal components due to the image signal $S_m$ because such signal components cancel each other.

Thus, the intermediate-frequency signal $S_i$ (and signal components with the angular frequency ($\omega_r+\omega_o$) and others) converted from the broadcast wave signal $S_r$ can be obtained from the adder 16.

The intermediate-frequency signal $S_i$ is supplied to a bandpass filter 17 for intermediate-frequency filtering. The bandpass filter 17 is formed, for example, of a biquad active filter using capacitors, resistors, and operational amplifiers and its passband is set to be 55 kHz$\pm$3 kHz. Thus, unnecessary signal components are attenuated by the bandpass filter 17 and only the intermediate-frequency signal $S_i$ is taken out.

The thus obtained intermediate-frequency signal $S_i$ is supplied to an AM detector 22 through an amplifier 21, and thereby, an audio signal $S_s$ (and a DC component V22 corresponding to the level of the intermediate-frequency signal $S_i$) is taken out and this audio signal $S_s$ is supplied to an audio amplifier 23 with differential inputs. The signal $S_s$ from the amplifier 23 is supplied to the speaker SP through the pin T8 and a capacitor C5.

The signal $S_{ib}$ from the mixer 12B is supplied to an AGC voltage generator 18 and, therein, an AGC voltage is generated. This AGC voltage is supplied to the amplifier 11 as the control signal of its gain and, therein, an AGC operation is performed on the signals $S_{ia}$ and $S_{ib}$. In this case, the generator 18 is connected to a capacitor C3 for smoothing the AGC voltage through the pin T5. The AGC voltage is further supplied as the reference voltage to each of operational amplifiers constituting the phase shifters 15A and 15B and the bandpass filter 17.

The detected output from the detector 22 is supplied to an AGC voltage generator 24 to obtain an AGC voltage, and this AGC voltage is supplied to the amplifiers 11 and 21 as the control signal of their gains and, therein, AGC operations are performed on the signals $S_{ia}$, $S_{ib}$, and $S_i$.

In this case, the generator 24 is connected to a capacitor C4 through the pin T6, and a low-pass filter is formed with this capacitor C4, and thereby, the DC voltage V22 is extracted from the detected output, and from this DC voltage V22 is generated the AGC voltage. The DC voltage V22 is supplied to the differential input of the amplifier 23, whereby the DC component V22 supplied, together with the audio signal $S_s$, from the detector 22 to the amplifier 23 is equivalently canceled.

Further, the amplifier 23 is connected with the variable resistor VR through the pin T7. The gain of the amplifier 23 is controlled according to the resistance value of the variable resistor VR and, thus, the volume control is achieved with this variable resistor VR.

The capacitor C6 is for bypassing signal components other than the audio signal $S_s$.

In the present example, since the intermediate frequency $f_i$ is sufficiently lower than the general intermediate frequency or receive band, the area occupied by the bandpass filter (intermediate-frequency filter) 17 for each step becomes larger but the number of steps for obtaining a required selectivity characteristic can be decreased. Accordingly, the area occupied by the whole of the bandpass filter 17 can be made smaller and hence it can be integrated into the IC arrangement.

When the intermediate frequency $f_i$ is low, the image characteristic generally becomes worse, but since the image signal $S_m$ is removed by 12A, 15A, and 16, the image characteristic is prevented from becoming worse.

Further, since the phase shifters 15A and 15B as well as the bandpass filter 17 are formed of active filters, there is a limit in the signal level which can be handled by each of the circuits 15A, 15B, and 17. However, since AGC is applied to the amplifier 12, the phase shifters 15A and 15B and the bandpass filter 17 can be prevented from being supplied with excessive inputs. An arrangement of AM/FM receiver with the described idea applied thereto is already disclosed in Japanese Laid-open Patent Publication No. 1-273432 (to which U.S. Pat. No. 5,020,147 corresponds).

When a one-chip IC is arranged with the above idea applied thereto and a radio receiver is integrated into such an arrangement, the frequency band of the audio amplifier 23 extends to the receive frequency band of the receiver. Accordingly, a high-frequency feedback loop passing through the bar antenna L1→receiving circuit system of the IC 10→output terminal pin T8→bar antenna L1 is formed, and therefore, when the output of the amplifier 23 is made greater (when the gain of the amplifier 23 is increased), a troublesome oscillating state is produced in the high-frequency band.

To avoid such trouble, such a method as follows can be considered to cut off the feedback loop:

1. To connect a capacitor C6 between the pin T8 and ground;
2. To increase the distance between the bar antenna L1 and the output terminal pin T8;
3. To insert a high-frequency choke coil between the output terminal pin T8 and the speaker SP; or
4. To insert a high-frequency choke coil between the power supply terminal pin T3 and the switch SW.

However, when the method of the item number 1 is used, it is required to make the impedance of the capacitor C6 sufficiently smaller than the impedance of the speaker SP at the frequency causing the oscillation. To meet this requirement, the capacity of the capacitor C6 must be great. Then, it becomes impossible to integrate the capacitor C6 into the IC 10, and it becomes necessary to attach the capacitor C6 externally to the IC 10, which leads an increase in the number of parts used.

When the method of the item number 2 is used, though the number of the parts is not increased, the miniaturization of the receiver becomes unachievable. Further, when the method of the item number 3 or 4 is used, the coil cannot be integrated into the IC and, hence, the number of parts increases, the same as in the case where the method of the item number 1 is used.

Thus, it has been difficult to obtain a miniaturized high-performance receiver.

SUMMARY OF THE INVENTION

The present invention is directed to the solution of the above described problem.

To solve the problem, this invention, using reference numerals corresponding to those used in the later described embodiment, comprises a current mirror circuit 53 having a transistor Q25 on the input side and a transistor Q26 on the output side, wherein the base-emitter junction area of the transistor Q26 on the output side is set to be N (N>1) times as large as the base-emitter junction area of the transistor Q25 on the input side, a parallel circuit of a first resistor R25 and a capacitor C25 is connected between the base of the transistor Q25 on the input side and its bias point Q27, a second resistor R26 is connected between the base of the transistor Q26 on the output side and the bias point Q27, and the resistance value of the first resistor R25 is set to be virtually N times as large as the resistance value of the second resistor R26, whereby when an input current i25 is supplied to the transistor Q25 on the input side, an output current i26 amplified for current by a factor N is obtained from the transistor Q26 on the output side, and the output current i26 is held lower than N times of the input current i25 when the frequency of the input current i25 and the output current i26 is high, due a decrease in the impedance of the capacitor C25.

The frequency characteristic of the current mirror circuit 53 is corrected by the capacitor C25 and the current gain is decreased when the frequency is higher than the frequency determined by the time constant of the capacitor C25 and the resistor R25 and above. Thereby, unnecessary signal is not amplified for current in the high-frequency band.

DESCRIPTION OF THE PREFERRED EMBODIMENTS

Figure 1:
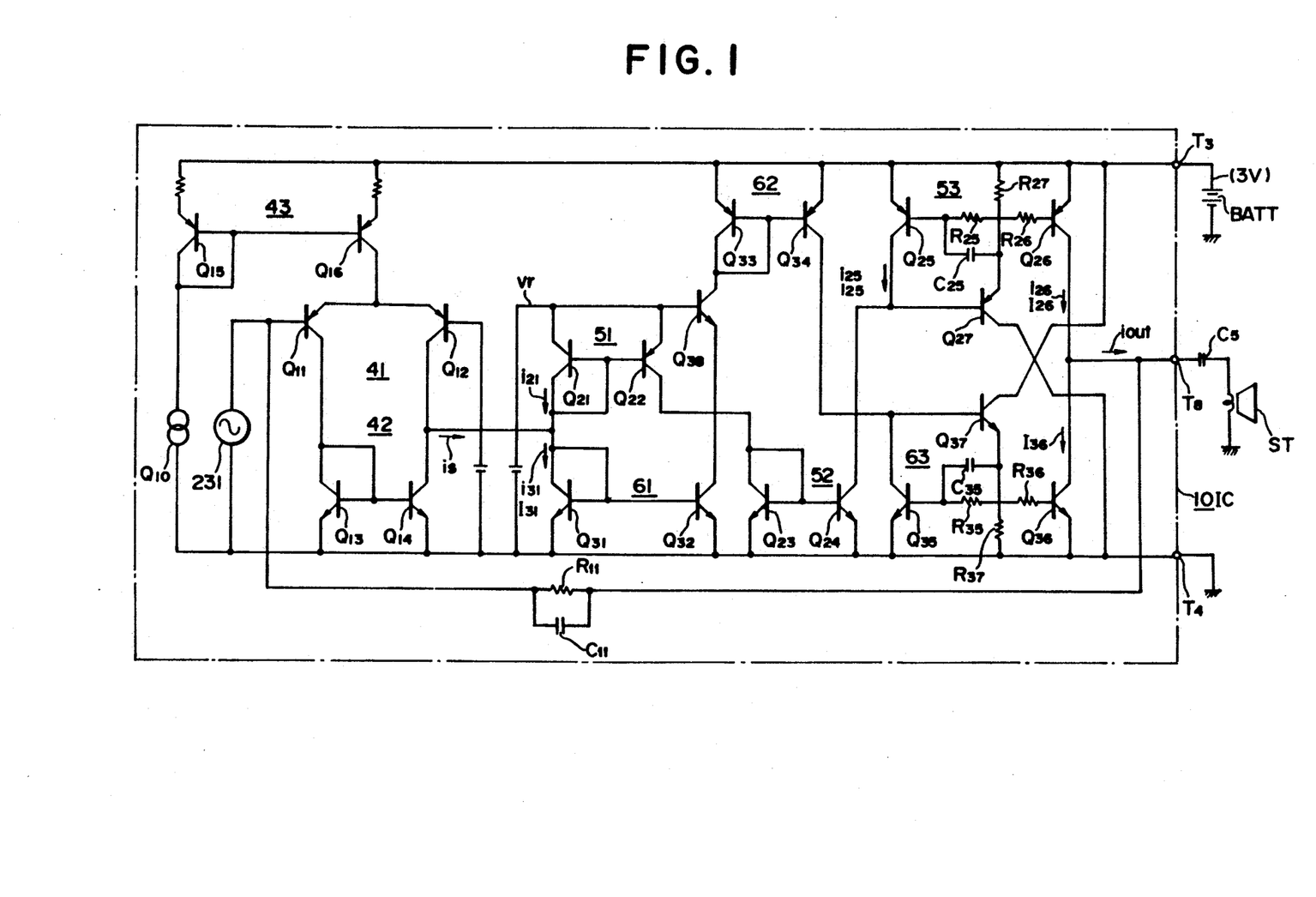
FIG. 1 is a connection diagram showing a portion of an example of the invention.

FIG. 1 shows an example of the power amplifying stage of the above described audio amplifier 23 of the IC 10.

Referring to FIG. 1, the emitters of the transistors Q11 and Q12 are connected in common with the collector of the transistor Q16 for constant-current supply and, thereby, a differential amplifier 41 having the power supply terminal pin T3 as its reference potential point is formed, and the audio signal from the preamplifier stage 231 of the amplifier 23 is supplied to the base of the transistor Q11. A current mirror circuit 42 is formed of transistors Q13 and Q14 with the terminal pin T4 used as its reference potential point, and the current mirror circuit is connected to the transistors Q11 and Q12 as the load thereof. Further, a transistor Q15 is connected to the transistor Q16 and, thereby, a current mirror circuit 43 is formed, with the transistor Q15 used as its input side and the terminal pin T3 used as its reference potential point, while the transistor Q15 is connected with a constant-current source Q10.

Thus, the power amplifier input portion is formed of the differential amplifier 41 and current-mirror circuits 42 and 43.

Further, a current mirror circuit 51 is formed of transistors Q21 and Q22 with a constant-voltage source Vr used as its reference potential point, while the collector of the transistor Q21 on its input side is connected with the collectors of the transistors Q12 and Q14, and the collector of the transistor Q22 on its output side is connected with the collector of a transistor Q23. This transistor Q23, together with a transistor Q24, forms a current mirror circuit 52 having the terminal pin T4 as its reference potential point, while the collector of the transistor Q24 on its output side is connected with the collector of a transistor Q25.

The transistor Q25, together with a transistor Q26, forms a current mirror circuit 53, having the transistor Q26 as the transistor on its output side, a transistor Q27 as that for its base bias, and the terminal pin T3 as its reference potential point, while the collector of the transistor Q26 is connected with the terminal pin T8.

In this case, in the current mirror circuit 53, there is connected a resistor R27 for setting the bias current between the emitter of the transistor Q27 and the terminal pin T3, and at the same time, resistors R25 and R26 are connected between the emitter of the transistor Q27 and the bases of the transistors Q25 and Q26, of which the resistor R25 is connected in parallel with a capacitor C25.

Further, a current mirror circuit 61 is formed of transistors Q31 and Q32 with the terminal pin T4 used as its reference potential point, while the collector of the transistor Q31 on its input side is connected with the collectors of the transistors Q12 and Q14, and the collector of the transistor Q32 on its output side is connected with the collector of a transistor Q33 through the transistor Q38 with its base grounded. The transistor Q33, together with a transistor Q34, forms a current mirror circuit 62 with the terminal pin T3 used as its reference potential point, while the collector of the transistor Q34 on its output side is connected with the collector of a transistor Q35.

The transistor Q35, together with a transistor Q36, forms a current mirror circuit 63 having the transistor Q36 as the transistor on its output side, a transistor Q37 as that for base biasing, and the terminal pin T4 as its reference potential point, while the collector of the transistor Q36 is connected with the terminal pin T8.

In the current mirror circuit 63, a resistor R37 for bias current setting is connected between the emitter of the transistor Q37 and the terminal pin T4, resistors R35 and R36 are connected between the emitter of the transistor Q37 and the bases of the transistors Q35 and Q36, and the resistor R35 has a capacitor C35 connected in parallel therewith.

Further, in the present example, each of the base-emitter junction areas of the transistors Q22 and Q32 on the output sides of the current mirror circuits 51 and 61 is made 6 times as large as each of the base-emitter junction areas of the transistors Q21 and Q31 on the input sides of the same, and similarly, each of the base-emitter junction areas of the transistors Q24 and Q34 is made 6 times as large as each of the base-emitter junction areas of the transistors Q23 and Q33. Further, each of the base-emitter junction areas of the transistors Q26 and Q36 is made 100 times as large as each of the base-emitter junction areas of the transistors Q25 and Q35.

As described above, the base-emitter junction area of the transistor on the output side has been made larger than the base-emitter junction area of the transistor on the input side by directly forming one area larger than the other. Other than that, while making equal the base-emitter junction area of the transistor on the input side and that of the transistor on the output side, the number of the transistors on the output side may be increased, or the number of the emitters of the transistor on the output side may be increased, so that the base-emitter junction area on the output side will become larger, in effect, than the base-emitter junction area of the transistor on the input side.

In proportion to the ratio of the base-emitter junction area (100) of the transistors Q26 and Q36 to the base-emitter junction area of the corresponding transistors Q25 and Q35, the resistance value of the resistors R25 and R35 is made 100 times as large as the resistance value of the corresponding resistors R26 and R36. For example, it is arranged such that
R25, R35=4 kΩ, R26, R36=35 to 40Ω,
R27, R37=120 kΩ, C25, C35=20 pF.

Thus a class-B power amplifier output portion is formed of the current mirror circuits 51 to 53 and 61 to 63.

The collectors of the transistors Q26 and Q36 are connected with the base of the transistor Q11 through a resistor R11 and a capacitor C11 for negative feedback.

The speaker SP is connected to the terminal pin T8 through a capacitor C5. The terminal pin T3 is connected with a battery BATT of 3 V, for example, as the power supply.

According to the above described arrangement, an audio signal is supplied from the preamplifier stage 231 to the differential amplifier 41 and thereby converted from voltage to current, and the signal current $i_s$ is output from the collectors of the transistors Q12 and Q14.

The signal period during which the current $i_s$ flows out of the collector of the transistor Q12 is called a positive half-cycle period and the signal period during which the current $i_s$ flows into the collector of the transistor Q14 is called a negative half-cycle period. The transistor Q31 is turned on by the current $i_s$ during the positive half-cycle period. Therefore, the positive half-cycle portion of the signal current $i_s$, indicated by a dotted line in FIG. 2, flows through the transistor Q31 as its collector current (signal current) i31 and this signal current i31 is passed through the signal lines of the current mirror circuit 61→current mirror circuit 62→current mirror circuit 63 and output to the terminal pin T8.

Figure 2:
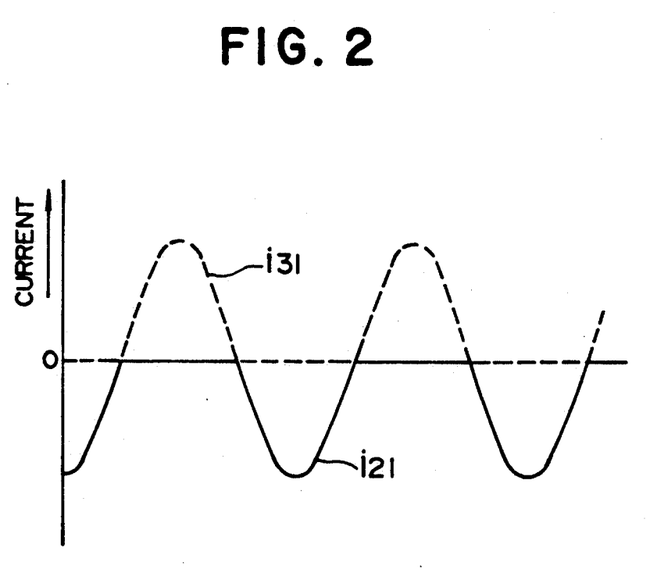
FIG. 2 is a waveform chart explaining operation of an example of the invention.

Further, since the transistor Q21 is turned on during the negative half-cycle period of the current $i_s$, the half-cycle portion of the signal current $i_s$, indicated by a solid line in FIG. 2, flows through the transistor Q21 as its collector current i21 and this signal current i21 is passed through the signal lines of the current mirror circuit 51→current mirror circuit 52→current mirror circuit 53 and output to the terminal pin T8.

Since, as described above, the base-emitter junction areas of the transistors on the output side are made 6 times, 6 times, and 100 times as large as the base-emitter junction areas of the corresponding transistors on the input side in the current mirror circuits (51, 61), (52, 62), and (53, 63) in the present example, the currents i31 and i21 are amplified for current by factors 6, 6, and 100 in the current mirror circuits (51, 61), (52, 62), and (53, 63), respectively, and totally amplified for current by a factor 3600 and output to the terminal pin T8. This amplified output is supplied to the speaker SP.

Further, since the current mirror circuits 53 and 63 are connected with elements R25, R26, C25, R35, R36, and C35, an oscillating state is not produced in the high-frequency band even when the output of the amplifier 23 is increased.

More specifically, as to the current mirror circuit 53, the following expressions apply
N: the ratio between base-emitter junction areas of the transistors Q26 and Q25, N=100
i25: AC component of the collector current of the transistor Q25
I25: DC component of the collector current of the transistor Q25
i26: AC component of the collector current of the transistor Q26
I26: DC component of the collector current of the transistor Q26
hFE: current amplification factor of the transistors Q25 and Q26
Z25: Impedance of the parallel connection of the elements R25 and C25

Since VT=kT/q, we obtain the following expression holding with respect to the voltage between the terminal pin T3 and the emitter of the transistor Q27

$$(VT/I25)\ i25 + Z25\ (i25/hFE) = (VT/I26)\ i26 + R26 \\ (i26/hFE). \qquad (1)$$

Since the currents I25 and I26 are small when the signal is of small intensity, the following relationships hold $$(VT/I25) > (Z25/hFE),$$

$$(VT/I26) > (R26/hFE).$$

Hence, the expression (1) becomes approximately $$(VT/I25)i25 = (VT/I26)i26$$

$$\therefore i26/i25 = (VT/I25)/(VT/I26)$$
$$= I26/I25$$
$$= 100(=N).$$

That is, the current gain of the current mirror circuit 53 when the signal is of small intensity becomes 100.

When the signal is of great intensity, the currents I25 and I26 become large and approximately the following relationships hold in the expression (1)

$$(VT/I25)i25 = 0,$$

$$(VT/I26)i26 = 0.$$

Hence, the expression (1) becomes $$Z25(i25/hFE) = R26(i26/hFE) \quad (2)$$

$$\therefore i26/i25 = Z25/R26.$$

When the signal frequency is low, the impedance of the capacitor C25 becomes high and hence $$Z25 = R25.$$

Therefore, the expression (2) becomes $$i26/i25 = R25/R26$$
$$= 100.$$

That is, even when the signal is of great intensity, the current gain of the current mirror circuit 53 becomes 100 provided that the signal frequency is low.

When the signal frequency is high, the impedance of the capacitor C25 becomes low, and hence $$Z25 = 1/(2\pi f\, C25)$$

where
f: signal frequency.
Therefore, the expression (2) becomes $$i26/i25 = 1/(2\pi f\, C25\, R26)$$
$$< 100.$$

That is, when the signal is of great intensity and the signal frequency is high, the current gain of the current mirror circuit 53 becomes smaller than 100.

In summary, the current gain of the current mirror circuit 53 becomes:

A. 100 when the signal is of small intensity, regardless of the signal frequency;

B. 100 when the signal is of great intensity and the signal frequency is low; and C. smaller than 100 when the signal is of great intensity and the signal frequency is high.

The current gains of the current mirror circuit 63 are entirely the same as those of the current mirror circuit 53.

According to the present invention, as described in the foregoing, the current gain of each of the current mirror circuits 53 and 63 becomes smaller than the standard value (=100) when the output is large and the frequency is in the high-frequency band and, hence, the current gain of the amplifier 23 becomes lower than the standard value (=3600). Consequently, the feedback loop including the amplifier 23 is cutoff and no oscillation is produced in the high-frequency band.

However, the amplifier 23 provides its standard gain for the audio signal and thereby achieves sufficient amplification of it, and it does not lower the distortion factor when the signal is of small intensity.

Further, since the need for using the methods 1 to 4 mentioned earlier can be eliminated, the parts externally attached can be reduced in number and, in addition, the operating characteristics required of the receiver are prevented from being deteriorated by the use of one of the methods 1 to 4. Furthermore, the degree of freedom in the arrangement of the OC 10 and the parts externally attached thereto can be made great and, accordingly, a miniaturized high-performance receiver can be provided.

What is claimed is:

1. An amplifier comprising:
a current mirror circuit having a transistor on an input side and a transistor on an output side, a base-emitter junction area of said transistor on the output side being N (N>1) times as large as a base-emitter junction area of said transistor on the input side;
a parallel circuit formed of a first resistor and a capacitor connected between a base connection of said transistor on the input side and a source of bias for said transistor on the input side; and
a second resistor connected between a base of said transistor on the output side and said source of bias, a resistance value of said first resistor being set to be substantially N times as large as a resistance value of said second resistor; whereby
when an input current is supplied to said transistor on the input side, an output current amplified by a factor N is obtained from said transistor on the output side, and
when the frequency of the input current and the output current is high, the output current is held lower than N times the input current by a decrease in impedance of said capacitor.

2. An amplifier comprising:
a transistor on an input side and a transistor on an output side, a base-emitter junction area of said transistor on the output side being N (N>1) times as large as a base-emitter junction area of said transistor on the input side, and emitters of said transistors being connected to a source of reference potentials;
a transistor for biasing, a base thereof being connected to a collector of said transistor on the input side and the emitter thereof being connected to said source of reference potential through a biasing resistor;
a parallel circuit formed of a first resistor and a capacitor connected between a base of said transistor on the input side and the emitter of said transistor for biasing; and
a second resistor connected between a base of said transistor on the output side and the emitter of said transistor for biasing, a resistance value of said first resistor being substantially N times as large as a resistance value of said second resistor; whereby when an input current is supplied to said transistor on the input side, an output current amplified by a factor N is obtained from said transistor on the output side, and when the frequency of the input current and the output current is high, the output current is held lower than N times said input current by a decrease in impedance of said capacitor.

* * * * *

UNITED STATES PATENT AND TRADEMARK OFFICE
CERTIFICATE OF CORRECTION

PATENT NO. : 5,285,172
DATED : February 8, 1994
INVENTOR(S) : Taiwa Okanobu and Hitoshi Tomiyama It is certified that error appears in the above-indentified patent and that said Letters Patent is hereby corrected as shown below:

Col. 5, line 23, after "leads" insert --to--
      line 62, after "due" insert --to--
Col. 8, line 42, after "apply" insert --.--
Col. 10, line 18, change "OC" to --IC--

In the Claims:

Col. 10, lines 54 & 55, change "potentials" to --potential--

Signed and Sealed this

Sixth Day of June, 1995

Attest:

BRUCE LEHMAN

Attesting Officer        Commissioner of Patents and Trademarks